(12) United States Patent
Nangare

(10) Patent No.: US 9,385,757 B1
(45) Date of Patent: Jul. 5, 2016

(54) SYSTEMS AND METHODS FOR USING A NON-BINARY SOFT OUTPUT VITERBI ALGORITHM

(71) Applicant: Marvell International Ltd., Hamilton (BM)

(72) Inventor: Nitin Nangare, Santa Clara, CA (US)

(73) Assignee: Marvell International Ltd., Hamilton (BM)

(*) Notice: Subject to any disclaimer, the term of this patent is extended or adjusted under 35 U.S.C. 154(b) by 288 days.

(21) Appl. No.: 14/031,637

(22) Filed: Sep. 19, 2013

Related U.S. Application Data

(60) Provisional application No. 61/706,556, filed on Sep. 27, 2012.

(51) Int. Cl.
*H03M 13/41* (2006.01)
*H03M 13/25* (2006.01)
*H03M 13/53* (2006.01)
*H04L 1/00* (2006.01)

(52) U.S. Cl.
CPC ............ *H03M 13/256* (2013.01); *H03M 13/41* (2013.01); *H04L 1/006* (2013.01)

(58) Field of Classification Search
CPC .............. H03M 13/256; H03M 13/41; H03M 13/2957; H03M 13/3905; H03M 13/4107; H03M 13/3961; H04L 1/006
See application file for complete search history.

(56) References Cited

U.S. PATENT DOCUMENTS

| | | | | |
|---|---|---|---|---|
| 7,162,675 B2 * | 1/2007 | Das et al. | ........................ | 714/751 |
| 7,865,814 B2 * | 1/2011 | Ashley et al. | ................. | 714/792 |
| 2004/0243914 A1 * | 12/2004 | Noda | ............................ | 714/792 |

* cited by examiner

*Primary Examiner* — Cynthia Britt
*Assistant Examiner* — Dipakkumar Gandhi

(57) ABSTRACT

Systems and methods are provided for generating a likelihood value. A detector identifies a winning path through a trellis and a plurality of losing paths through the trellis and computes path metric differences within the trellis based on the winning path and at least some of the plurality of losing paths. The detector calculates a pair of error metrics based on the path metric differences and determines the likelihood value based on a difference between the pair of error metrics.

20 Claims, 9 Drawing Sheets

SYSTEMS AND METHODS FOR USING A NON-BINARY SOFT OUTPUT VITERBI ALGORITHM

CROSS REFERENCE TO RELATED APPLICATION

This application claims the benefit under 35 U.S.C. §119 (e) of U.S. Provisional Application No. 61/706,556, filed Sep. 27, 2012, the contents of which are hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to soft output Viterbi algorithms (SOYA). Consider a system that can be represented by a finite state machine. For example, a finite state machine can be used to model an inter-symbol-interference (ISI) channel or a convolutional code encoder. A trellis diagram can be used to represent the sequence of all possible paths (i.e., sequences of states) that the system can visit over time. If the system can transition from state A at time t to state B at time t+1, then these states are connected by a branch. Each branch may be labeled by an X/Y pair, where X denotes the input that causes the system to transition from state A to B and Y represents an output corresponding to this transition. For example, a channel with a two-bit channel response can be represented by a four-state trellis diagram. The states of this trellis can be labeled as 00, 01, 10, 11 and may be associated with the latest two bits transmitted through the channel. For example, if the system is at state 01 at time t, and 0 is transmitted, then the next state at time t+1 would be 10. Similarly, the system would transition to state 11 if 1 were transmitted. Channel output Y that results from these transitions is a real number m, that may be different for each branch. The signals at the output of the channel are detected by a trellis-based detector, such as a Viterbi (maximum-likelihood) detector, which is based on the trellis representing the channel.

However, a Viterbi detector does not receive the particular path that occurred in the trellis of the channel. Rather, the Viterbi detector uses the signals/bits it receives to find the trellis path that most-likely occurred based on the received signals/bits. This detection is often complicated by the presence of noise or errors in the received signals or bits. In some situations, the trellis path that most-likely occurred based on the received signals or bits may not be the same as the trellis path that actually occurred in the channel.

SUMMARY

In accordance with an implementation of the disclosure, systems and methods are provided for generating a likelihood value. A detector identifies a winning path through a trellis and a plurality of losing paths through the trellis and computes path metric differences within the trellis based on the winning path and at least some of the plurality of losing paths. The detector calculates a pair of error metrics based on the path metric differences and determines the likelihood value based on a difference between the pair of error metrics.

A first error metric in the pair is determined based on a most likely symbol $u_{ML}$ in the winning path and another symbol $u_j$, and a second error metric in the pair is determined based on the most likely symbol $u_{ML}$. A reference value for each error metric in the pair is a most likely symbol $u_{ML}$ in the winning path. The pair of error metrics are elements in a vector of error metrics, where a length of the vector of error metrics is one less than a number of candidate symbols.

In some implementations, calculating the pair of error metrics comprises updating an error metric in the pair to be equal to one of the path metric differences when it is determined that a previous value of the error metric in the pair is greater than the one of the path metric differences. The detector may further determine a plurality of additional likelihood values, where the likelihood value and each additional likelihood value is associated with a corresponding candidate symbol value. The likelihood value that is determined by the detector may used in a soft output Viterbi algorithm (SOVA).

In accordance with an implementation of the disclosure, a detector comprises circuitry communicatively coupled to a memory. The circuitry is configured to identify a winning path through a trellis and a plurality of losing paths through the trellis and compute path metric differences within the trellis based on the winning path and at least some of the plurality of losing paths. The circuitry is further configured to calculate a pair of error metrics based on the path metric differences and determine the likelihood value based on a difference between the pair of error metrics.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to determining likelihood values at a detector that provides soft information. To provide an overall understanding of the disclosure, certain illustrative embodiments will now be described, including a modified Viterbi detector that performs a traceback operation to compute error metric values and corresponding likelihood values. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

Figure 1:
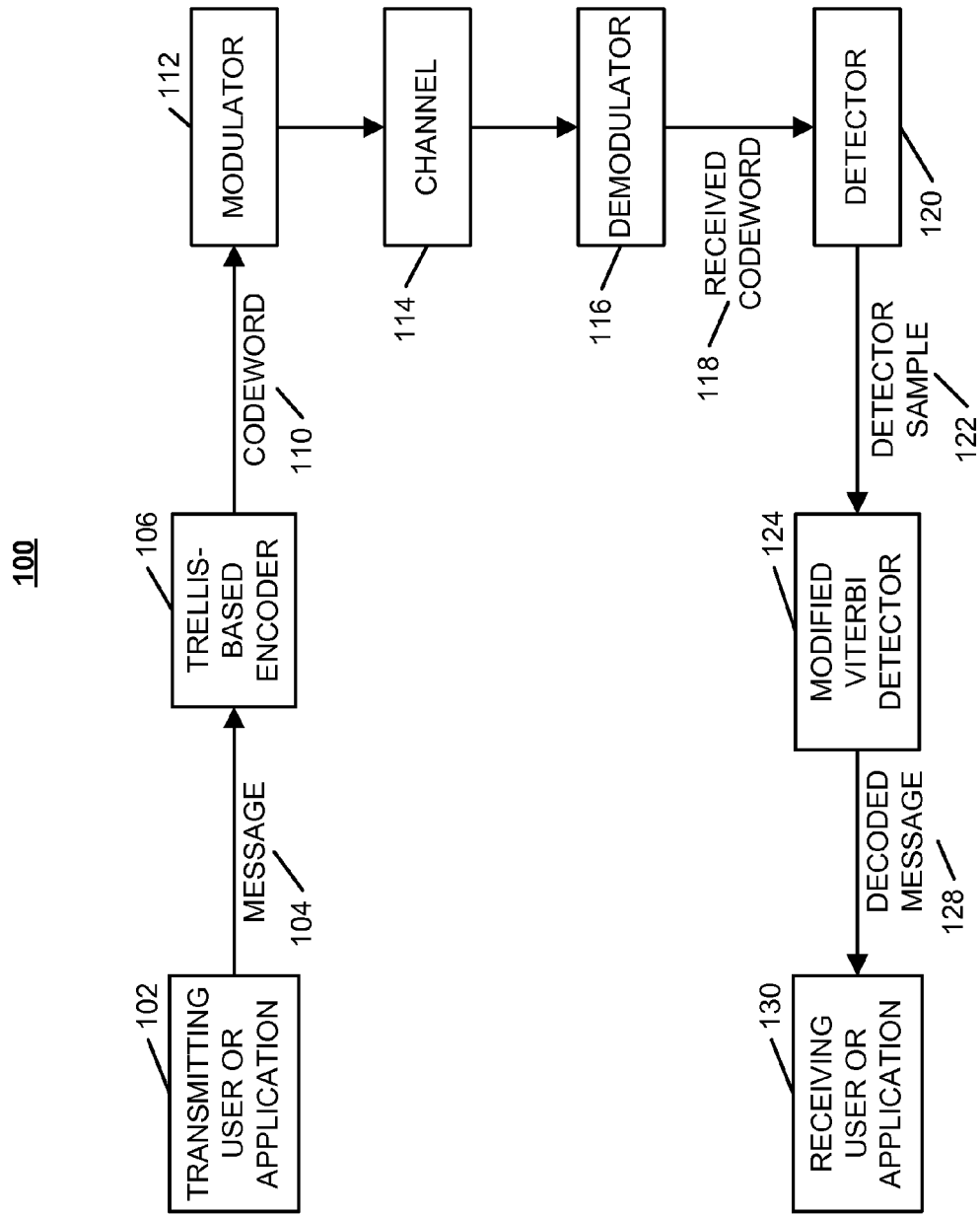
FIG. 1 is a block diagram of an illustrative communications system employing a Viterbi detector, in accordance with an embodiment of the present disclosure.

FIG. 1 shows an illustrative communications system 100 for decoding based, in part, on a trellis-based code, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

Message 104 that is intended for communication, storage, or both may be encoded by a trellis-based encoder 106 to generate codeword 110, which includes parity information or parity bits. The trellis-based encoder 104 introduces additional information such that codeword 110 includes more bits than message 104. In some embodiments, a portion of the codeword 110 may include the message 104, in which case, the encoder is known as a "systematic" encoder.

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or on which it is stored, before being recovered at a demodulator 116. For example, the channel 114 may be a storage channel that represents a storage medium in a computer system environment or a communications channel that represents the wireless propagation environment in a wireless communications environment. Various characteristics of the channel 114 may corrupt data that is communicated or stored thereon. For example, the channel 114 may be a non-ideal memoryless channel or a channel with memory. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114. In some cases, the term "channel" as used herein may also include the modulator 112 and the demodulator 116.

While in the channel 114, the signal may encounter error-producing phenomena, such as device physical failure, device electrical failure, signal interference, and/or data loss due to buffer overflow, for example. The interference signals and other error-producing phenomena in a channel 114 will be referred to herein as "noise." As shown by the description above, the terms channel and noise are more conceptual than physical, but they may correspond to physical aspects of a system. For ease of explanation, it will be assumed that in this embodiment the channel 114 of FIG. 1 is not an ISI channel. However, channel 114 can include an ISI channel in another embodiment.

The received codeword 118 contains information related to the codeword 110 and may be a corrupted or otherwise altered version of the codeword 110 originally outputted by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which is an estimate of the original data message 104. The detector 120 samples each symbol in the received codeword 118 and assigns each symbol to a bin based on its value. In some embodiments, the bin is assigned based on a probability distribution. Each symbol sampled by the detector 120 is assigned to one of two or more possible bins, or states.

If there are no errors in the received codeword 118, the received codeword 118 is the same as the codeword 110. If there are errors, however, modified Viterbi decoder 124 may be able to correct some or all of the errors by using maximum-likelihood detection. If the modified Viterbi decoder 124 is able to correct all of the errors, the decoded message 128 will be the same as the message 104. Modified Viterbi decoder 124 receives and iteratively processes the detector sample 122. The detector 120 and the modified Viterbi decoder 124 may be two separate processors, or a single processor may be used as both the detector 120 and the modified Viterbi decoder 124.

In general, the modified Viterbi decoder 124 comprises control circuitry and/or decoding circuitry used to iteratively correct and/or detect errors present in the detector sample 122, for example, due to transmission through the channel 114. In general, detection/decoding operate based on the same concept of computing metrics for each branch of the trellis; the trellis is based on receiving the signals/bits, and then identifying the path through the trellis that has the lowest cumulative metric. The cumulative metric of a path will be referred to herein as a "path metric." Additionally, the path that has the lowest path metric will be referred to as the "winning path," and the trellis state at the end of the winning path will be referred to as the "winning state." All paths other than the winning path will be referred to as "losing paths." Suitable methods for processes that are performed by modified Viterbi detector 124 are described in more detail in relation to FIGS. 2-8.

The modified Viterbi decoder 124 provides the decoded message 128 to the receiving user or application 130. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the modified Viterbi detector 124 corrects all errors that are induced by the channel 114 and other communications effects in the communications system 100, then the decoded message 128 is a logical replica of the message 104.

Figure 2:
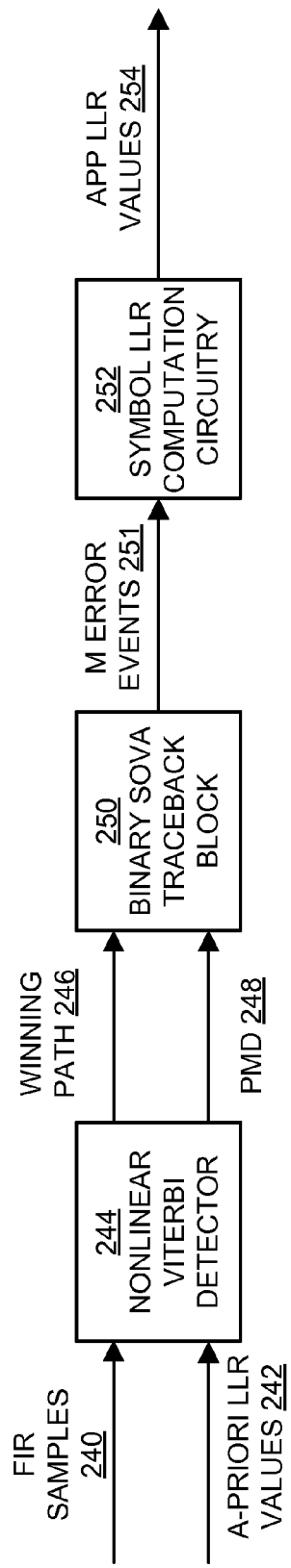
FIG. 2 is a block diagram of an illustrative modified Viterbi detector, in accordance with an embodiment of the present disclosure.

FIG. 2 is a block diagram of a modified Viterbi detector 200. Modified Viterbi detector 200 may be used as modified Viterbi detector 124 in system 100. Modified Viterbi detector 200 includes a nonlinear Viterbi detector 244, a binary SOVA traceback block 250, and symbol LLR computation circuitry 252. In particular, FIR samples 240 of a received signal and corresponding a-priori LLR values 242 of the samples 240 are provided to nonlinear Viterbi detector 244, which provides a winning path 246 and one or more path metric differences (PMDs) 248 to binary SOVA traceback block 250. Symbol LLR computation circuitry 252 performs computation of symbol LLRs based on error metrics that are computed by binary SOVA traceback block 250.

Nonlinear Viterbi detector 244 processes FIR samples 240 and LLR values 242 to obtain a winning path 246 through a trellis and PMD values 248. In particular, nonlinear Viterbi detector 244 may include components that perform the forward computation of branch metrics (BM) and the updating of the path metrics (PM). In an example, nonlinear Viterbi detector 244 performs hard decision decoding. In this case, the BMs may be computed as a square of the difference between a received FIR sample 240 and an expected value. Thus, a large value for a BM indicates a large difference between a received sample and an expected value and is indicative that an error may have occurred. Updating the PM involves accumulating or summing the BMs for the branches in each path.

When nonlinear Viterbi detector 244 reaches the end of the forward computation (i.e., the last symbol, the last state, or the last time instance), nonlinear Viterbi detector 244 provides winning path 246 (which may also be referred to as the most likely path (ML-path) or the best path) and the path-metric differences PMD 248. In particular, nonlinear Viterbi detector 244 may select from a set of candidate paths to determine the winning path 246 with the lowest PM. The PM with the lowest value corresponds to the path that has, on average, the lowest deviation between the received FIR samples 240 and the expected values of samples 240. A low deviation is an indication that a small number of errors has occurred, the values of the error are small, or a combination thereof. The PM of the winning path or the most likely path is referred to herein as $PM_{ML}$. Then, nonlinear Viterbi detector 244 computes the difference between the set of PMs associated with the losing paths (which may also be referred to as the alternate paths) and $PM_{ML}$ to obtain PMD values 248.

Binary SOVA traceback block 250 receives winning path 246 and PMD values 248 from nonlinear Viterbi detector 244 and performs trace-back to find the N error-events. During trace-back, binary SOVA traceback block 250 may consider any number of the losing paths, such as the second best path, the third best path, or any other suitable number P of losing paths. Binary SOVA traceback then selects M out of N error events and performs post-coding on the error events if there was precoding performed. In particular, the N error events may be sorted according to the corresponding PMD values of the N error events. The selected M error events correspond to those with the smallest PMDs.

Binary SOVA traceback 250 performs a traceback operation to obtain error metric values. An example traceback operation is described in detail in relation to FIGS. 4, 5, and 7. In particular, binary SOVA traceback block 250 provides the selected M error events 251 to symbol LLR computation circuitry 252, which operates on the error events to determine a posteriori probability LLR values 254. The M error events 251 may be post-coded, and the corresponding PMDs (which are also referred to herein as error metrics) of the M error events may also be provided to symbol LLR computation circuitry 252. An example process for determining a set of LLR values based on a set of error events and its error metric values is described in detail in relation to FIG. 7.

In some embodiments, a set of candidate symbols are taken from a Galois field of size q (i.e., GF(q)). In an example, an index i (starting at 0 and ending at q−1) may be used to indicate a candidate symbol $u_i$ in the set of q candidate symbols. As used herein, $\lambda_u$ refers to a log probability, or a log likelihood value for a symbol u. In particular, the log likelihood value that a symbol u is equal to a candidate symbol value $u_i$ may be written as $\lambda_u(u_i) = \log(u = u_i))$.

Furthermore, a vector (with length q) of log likelihood ratio (LLR) values $L_u$ may be defined as:

$$L_u = \begin{bmatrix} \log\left(\frac{p_u(u = u_0)}{p_u(u = u_0)}\right) \\ \log\left(\frac{p_u(u = u_0)}{p_u(u = u_1)}\right) \\ \vdots \\ \log\left(\frac{p_u(u = u_0)}{p_u(u = u_{q-1})}\right) \end{bmatrix} = \begin{bmatrix} 0 \\ \lambda_u(u_0) - \lambda_u(u_1) \\ \vdots \\ \lambda_u(u_0) - \lambda_u(u_{q-1}) \end{bmatrix}_{q \times 1} \quad (1)$$

where each element in the vector $L_u$ is the difference between two log likelihood values: a reference log likelihood value (corresponding to $\lambda_u(u_0)$) and each of the log likelihood values $\lambda_u(u_i)$ for i=0, 1, ..., q−1. Thus, each value in the vector $L_u$ is based on a comparison between a log likelihood value of the same reference ($u_0$) and each of the corresponding q log likelihood values. In an example, $u_0=0$ such that the reference symbol for the LLR vector $L_u$ is zero.

In some embodiments, an error metric vector $eM_u$ with length (q−1) is defined as the probability of making an error for a particular symbol value. In particular, $eM_u$ may be defined similarly as $L_u$ as a log likelihood ratio. However, while the reference value for $L_u$ is $u_0$, the reference value for $eM_u$ is $u_{ML}$. Furthermore, instead of being based on the log likelihood values $\lambda_u(\lambda_i)$ for i=0, 1, ..., q−1, the vector $eM_u$ is based on the log likelihood values $\lambda_u([u_{ML} \oplus i])$ for i=1, 2, ..., q−1, where the symbol $\oplus$ indicates an exclusive OR (XOR) function.

$$eM_u = \begin{bmatrix} \log\left(\frac{p_u(u = u_{ML})}{p_u(u = [u_{ML} \oplus 1])}\right) \\ \log\left(\frac{p_u(u = u_{ML})}{p_u(u = [u_{ML} \oplus 2])}\right) \\ \vdots \\ \log\left(\frac{p_u(u = u_{ML})}{p_u(u = [u_{ML} \oplus (q-1)])}\right) \end{bmatrix} = \begin{bmatrix} \lambda_u(u_{ML}) - \lambda_u([u_{ML} \oplus 1]) \\ \lambda_u(u_{ML}) - \lambda_u([u_{ML} \oplus 2]) \\ \vdots \\ \lambda_u(u_{ML}) - \lambda_u([u_{ML} \oplus (q-1)]) \end{bmatrix}_{(q-1) \times 1} \quad (2)$$

The above equation indicates that the error metric vector $eM_u$ is based on each comparison between the likelihood value of the most likely symbol $u_{ML}$ and the likelihood value of each candidate symbol that is different from the most likely symbol $u_{ML}$. In particular, the error metric vector $eM_u$ has length (q−1) because it is not necessary to compute the XOR of $u_{ML}$ and zero, because the XOR of this pair is simply $u_{ML}$. The above equation is described for illustrative purposes only, and the right-hand side of the equation may be preferable to represent in hardware because of its ease of computation compared to performing a log computation of a quotient.

Figure 3:
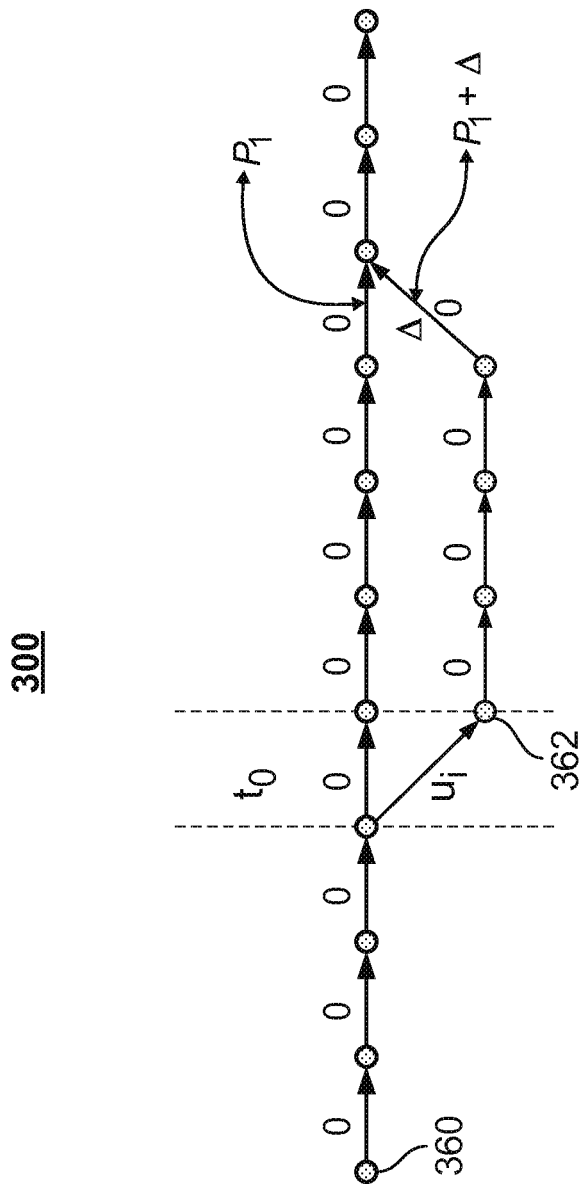
FIG. 3 is a graphical illustration of a winning path and a losing path for a trellis having two states, in accordance with an embodiment of the present disclosure.

FIG. 3 is a graphical illustration of a winning path 360 and a losing path 362 for a binary SOYA. In particular, the path metric $P_1$ of the winning path 360 is the lowest path metric PM out of the set of PMs for various paths through the trellis. Since PM is always positive, the minimum PM corresponds to the winning path 360. As shown in FIG. 3, the losing path 362 has a PM value of $P_1+\Delta$, which is larger than the PM of the winning path by an amount $\Delta$.

The zero values for each time instance along winning path 360 indicate that there is no deviation along the path from the best path. For the first three time instances, losing path 362 shares the same three branches as winning path 360. However, at time instance $t_0$, losing path 362 is associated with an error and deviates from winning path 360 (as shown by $u_i$ at time $t_0$). Losing path 362 deviates from winning path 360 for five time instances before returning to winning path 360 for the last two time instances shown in FIG. 3.

In the example shown in FIG. 3, maximum a posteriori (MAP) decoding, such as a Bahl Cocke Jelinek Raviv (BCJR) technique, may be performed. In BCJR, the a posteriori probability is maximized in order to minimize the bit error probability. While the BCJR technique provides an optimal solution by providing the MAP results, the BCJR technique is computationally expensive and time-consuming. In an example, the BCJR technique may compute the log likelihood ratios (LLR) of a symbol $u_i$ according to:

$$LLR(u_i) = \min_{all\ paths\ u(t)=0}(PM) - \min_{all\ paths\ u(t)=u_i}(PM) \quad (3)$$

That is, in order to compute the symbol LLRs, the BCJR technique requires determining the global minimum path metric for all paths that have $u(t)=0$ and determining the global minimum path metric for all paths that have $u(t)=u_i$. While this process may provide an optimal solution, it can be computationally expensive and time-consuming.

Assuming that a single error event has occurred, the probability that the symbol u at time $t_0$ is zero corresponds to: $p_u(u(t_0)=0/y) \approx e^{-P_1}$, where y is a received sample at the input to the detector, and the probability that the symbol u at time $t_0$ is $u_i$ corresponds to: $p_u(u(t_0)=u_i/y) \approx e^{-(P_1+\Delta)}$. The probabilities are proportional to the right hand side of these equations because some constant terms related to noise and signal-to-noise ratio (SNR) are not shown. The systems and methods described herein may be used to achieve performance that is similar to BCJR but with far less complexity.

Figure 4:
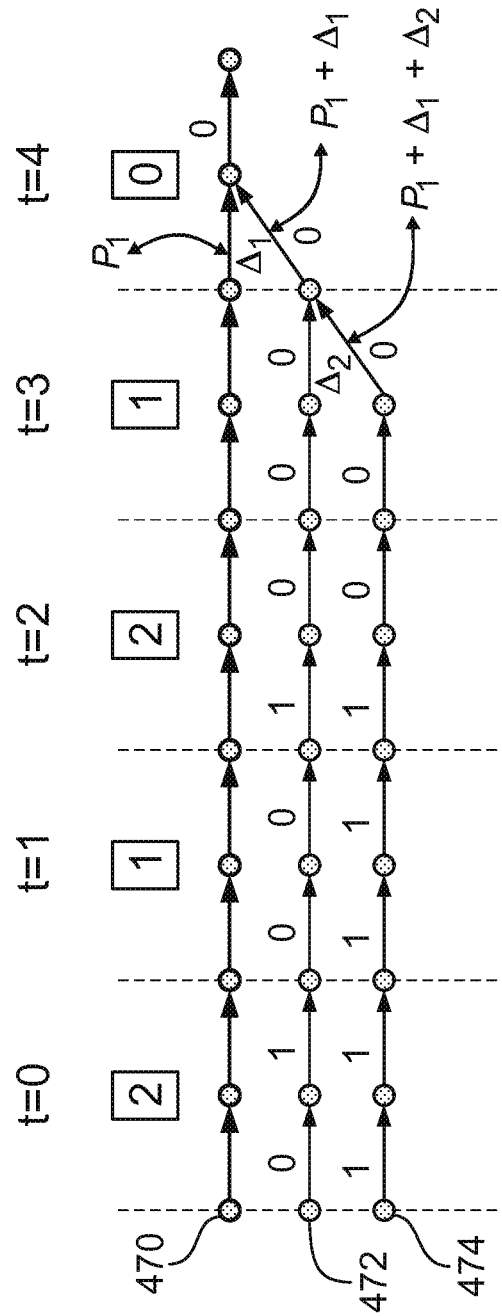
FIG. 4 is a graphical illustration of a winning path and two losing paths that are evaluated during a first step of a traceback process, in accordance with an embodiment of the present disclosure.

FIG. 4 is a graphical illustration 400 of a winning path 470 and two losing paths 472 and 474 that are evaluated during a first step of a traceback process that may be performed by binary SOVA traceback block 250. In the example shown in FIG. 4, symbols are taken from GF(4), and a traceback depth is one. The traceback depth determines a number of losing paths that are evaluated during the traceback process. In particular, for a traceback depth d, there are $2^d$ losing paths that are evaluated, or "traced back." In the example shown in FIG. 4, because the traceback depth is one, two losing paths are evaluated. A traceback depth of one is used herein for ease of illustration, but in general, any traceback depth may be used, and any number of losing paths may be considered. For ease of illustration, the set of candidate symbols taken from GF(4) are assumed to be 0, 1, 2, and 3. However, one of ordinary skill in the art will understand that any size of any set of candidate symbols may be used without departing from the scope of the present disclosure.

In the example shown in FIG. 4, each time instance (defined by t=0, t=1, t=2, t=3, and t=4) has the length of two bits for GF(4). Furthermore, the winning path 470 includes a set of most likely symbol values for the five time instances. In particular, $u_{ML}(t=0)=2$, $u_{ML}(t=1)=1$, $u_{ML}(t=2)=2$, $u_{ML}(t=3)=1$, and $u_{ML}(t=4)=0$. Similarly, each of losing paths 472 and 474 includes a set of error symbol values depicted above each losing path 472 and 474. The set of error symbol values represents differences between the symbol values for the corresponding losing path 472 or 474 and the symbol values for winning path 470. The error symbol values for each losing path 472 and 474 is determined based on an XOR operation that is performed on the symbol values for the losing path and the symbol values for winning path 470. In an example, at time t=2, losing path 472 has symbol value $(00)_2$, while winning path 470 has symbol value $(10)_2$. In this case, the XOR of $(00)_2$ and $(10)_2$ is $(10)_2$, which is the error symbol value for losing path 472 at time t=2. Winning path 470 has a lowest PM value of $P_1$, losing path 472 has a larger PM value of $P_2+\Delta_1$, and losing path 474 has an even larger PM value of $P_1+\Delta_1+\Delta_2$. As shown in FIG. 4, $P_{21}$ corresponds to a PM of a path that has nine bits (in particular, two bits for each of four complete symbols at t=0, 1, 2, and 3, and one bit for the half symbol at time t=4). As used herein, $P_1$ may be referred to as a local metric.

Figure 7:
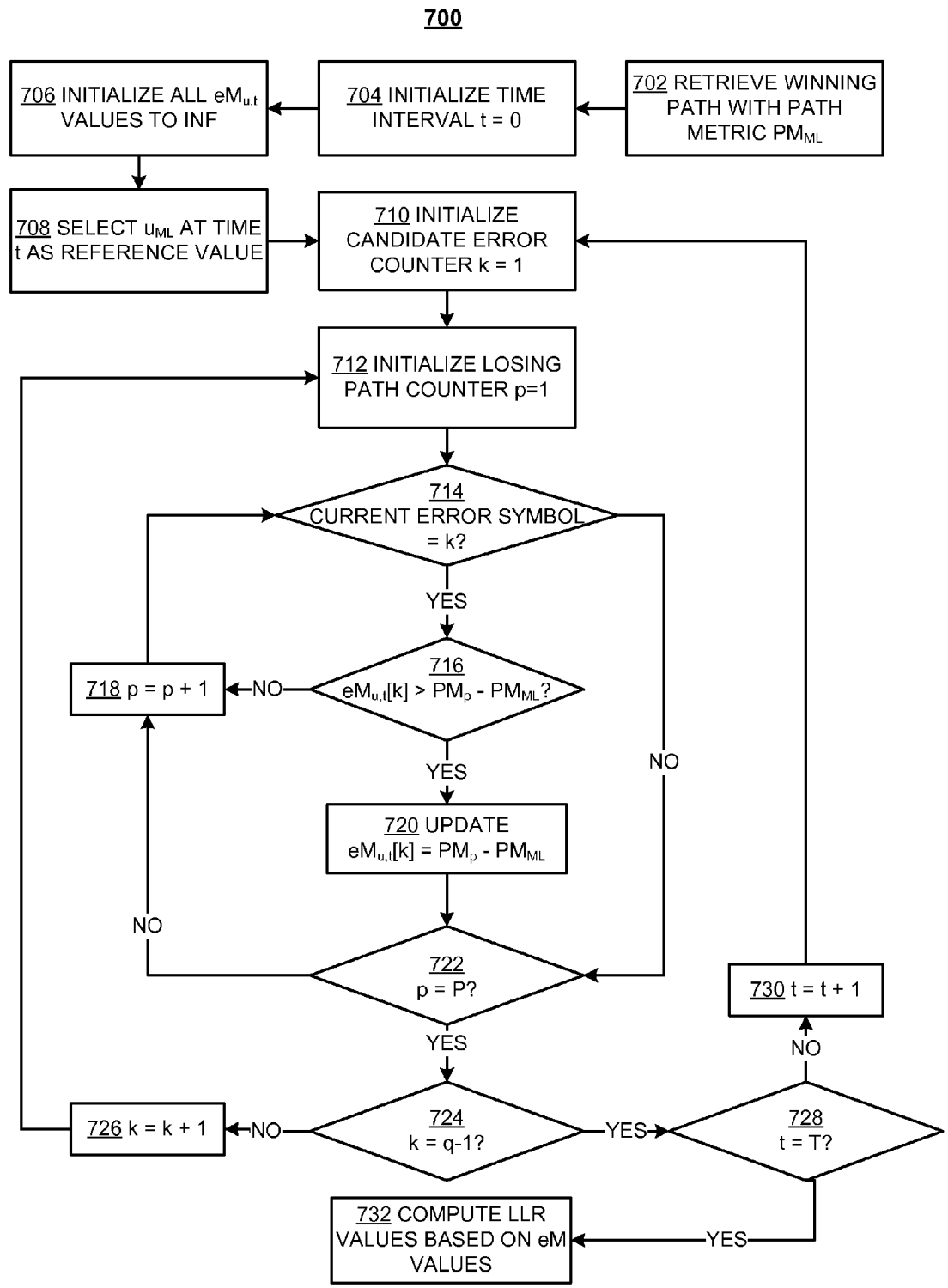
FIG. 7 is a flow chart of a process for updating error metric values and calculating likelihood values, in accordance with an embodiment of the present disclosure.

An example of the traceback process is described in relation to FIG. 7. During an initial step of the traceback process, a set of vectors of error metric values $eM_{u,t}$ is initialized, where the index t denotes the time instance. As described above, the length of each vector $eM_{u,t}$ is q−1, or three in this example. Considering the first three time instances shown in FIG. 4 (t=0, t=1, and t=2), $eM_{u,0}$, $eM_{u,1}$, and $eM_{u,2}$ are each initialized to a 3×1 vector with elements of ∞, where each $k^{th}$ element in a vector $eM_{u,t}$ corresponds to an error metric associated with a possible error that has a deviation from the winning path. The values of the elements in the vector $eM_{u,t}$ provide an indication of a probability that an error was made for the corresponding symbol.

$$eM_{u,0} = eM_{u,1} = eM_{u,2} = eM_{u,3} = \begin{bmatrix} \infty \\ \infty \\ \infty \end{bmatrix} \quad (4)$$

As described in this example, the traceback process operates from right to left. However, in general, the traceback process may operate in any direction, including from left to right. In an illustrative example, starting at t=3, the value for both losing paths 472 and 474 is $(00)_2$, indicating zero error. In this case, none of the elements in the error metric vector $eM_{u,3}$ are updated.

Then, at t=2, the error symbol value for both losing paths 472 and 474 is $(10)_2$. In this case, the result of an XOR operation between $u_{ML}(t=2)$ (i.e., 2) and the error symbol value is used to set a decision and ultimately a log likelihood value. In particular, $(10)_2$ XOR $(10)_2$ results in a decision $(00)_2$. Thus, $\lambda_u(0)$ is set to be equal to the negative of the PM of the corresponding path. In this case, because both losing paths 472 and 474 have the same error symbol value, the path with the lower PM is selected (i.e., losing path 472). As indicated by Eq. 2, the second element of the error metric vector $eM_{u,2}$ is written as $\lambda_u(u_{ML}) - \lambda_u([u_{ML} \oplus 2])$. Since $u_{ML}(t=2)=2$, this expression becomes $\lambda_u(2) - \lambda_u([2 \oplus 2]) = \lambda_u(2) - \mu_u([0]) = -(P_1) - (-(P_1+\Delta_1)) = \Delta_1$. Thus, the second element in $eM_{u,2}$ is updated to $\Delta_1$. In other words, the second element in $eM_{u,2}$ is updated to the minimum of the current value of the second element in $eM_{u,2}$ and the lower of the differences between the path metrics of winning path 470 and losing paths 472 and 474.

$$eM_{u,2}[k=2]=\min(eM_{u,2}[k],\Delta_1,\Delta_1+\Delta_2) \quad (5)$$

Because the values of $\Delta_1$ and $\Delta_2$ are positive, $\Delta_1<\Delta_1+\Delta_2$, and the value of $eM_{u,2}[k=2]$ is updated from $\infty$ to $\Delta_1$.

$$eM_{u,2} = \begin{bmatrix} \infty \\ \Delta_1 \\ \infty \end{bmatrix} \quad (6)$$

The three values ($eM_{u,2}[k]$, $\Delta_1$, and $\Delta_1+\Delta_2$) may be simultaneously compared. Alternatively, $eM_{u,2}[k]$ may be initially compared to $\Delta_1$, and path 474 may not need to be considered because the paths with lower PMs may be considered before paths with higher PMs. Neither losing path 472 nor losing path 474 have an error symbol value of $(01)_2$ or $(11)_2$ at $t=2$, so the values of $eM_{u,2}[k=1]$ and $eM_{u,2}[k=3]$ are not yet updated.

At $t=1$, the value for losing path 472 is $(00)_2$, indicating zero error. However, the value for losing path 474 is $(11)_2$, indicating that the third value in $eM_{u,1}$ should be updated to the difference in path metrics for losing path 474 and winning path 470. That is, the value of $eM_{u,1}[k=3]$ is updated from $\infty$ to $\Delta_1+\Delta_2$.

$$eM_{u,1} = \begin{bmatrix} \infty \\ \infty \\ \Delta_1+\Delta_2 \end{bmatrix} \quad (7)$$

Neither losing path 472 nor losing path 474 have an error symbol value of $(01)_2$ or $(10)_2$ at $t=1$, so the values of $eM_{u,1}[k=1]$ and $eM_{u,1}[k=2]$ are not yet updated.

At $t=0$, the value for losing path 472 is $(01)_2$, and the value for losing path 474 is $(11)_2$. Because losing paths 472 and 474 have different non-zero values, this means that two values in $eM_{u,0}$ should be updated. In particular, $$eM_{u,0} = \begin{bmatrix} \Delta_1 \\ \infty \\ \Delta_1+\Delta_2 \end{bmatrix}.$$

Figure 5:
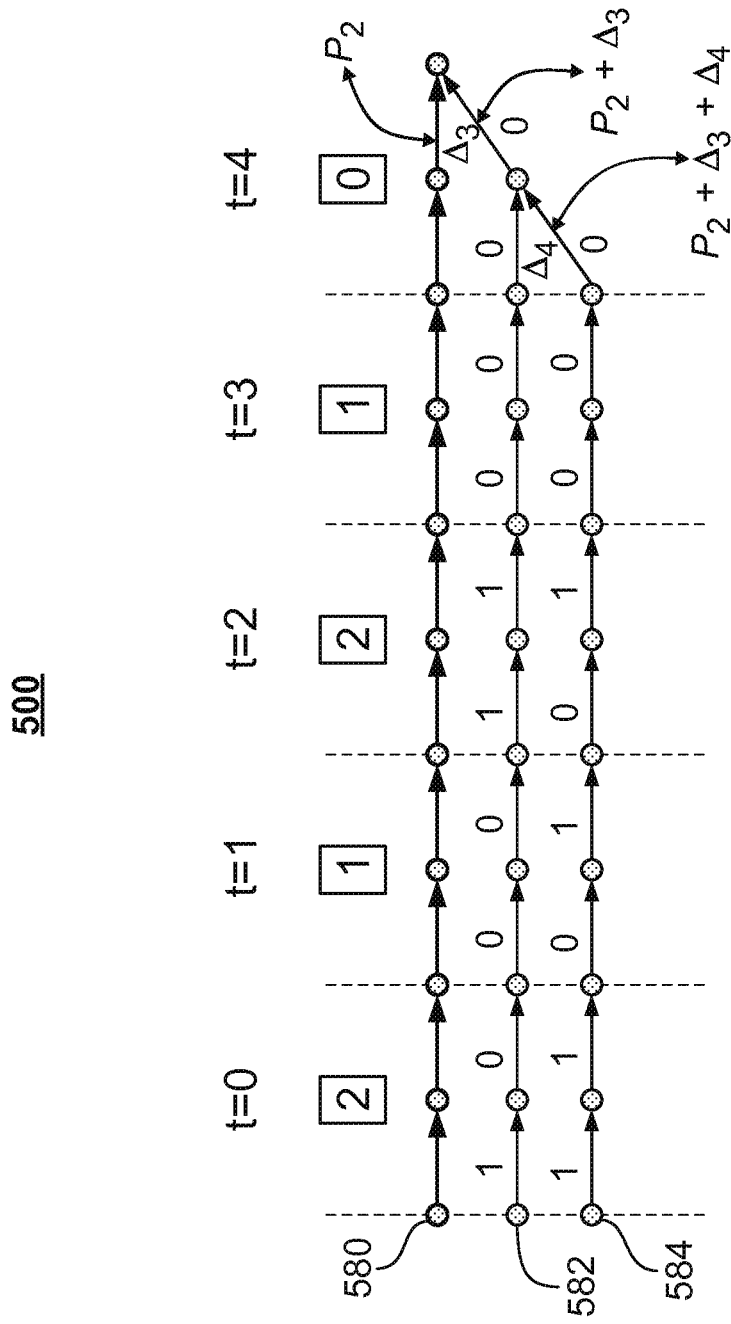
FIG. 5 is a graphical illustration of a winning path and two losing paths that are evaluated during a second step of a traceback process, in accordance with an embodiment of the present disclosure.

FIG. 5 is a graphical illustration 500 of a winning path 580 and two losing paths 582 and 584 that are evaluated during a second step of a traceback process that may be performed by binary SOVA traceback block 250. As in the example shown in FIG. 4, symbols are taken from GF(4), and a traceback depth is one. Graphical illustration 500 is similar to graphical illustration 400, except that the two losing paths 472 and 474 in FIG. 4 are replaced with two other losing paths 582 and 584. In the example shown in FIG. 5, the PM of winning path 580 is $P_2$, which may be different from $P_1$. As is described in relation to FIG. 4, $P_1$ is the local metric of a path with nine bits. As shown in FIG. 5, $P_2$ is the local metric of a path with ten bits (in particular, five complete symbols for times $t=0, 1, 2, 3$, and 4). In an example, nonlinear Viterbi detector 244 operates from left to right (i.e., in chronological order). For each computation of a new PM, binary SOVA traceback block 250 operates from right to left (i.e., in reverse chronological order, thereby allowing for computation in pipeline stages. The losing paths have corresponding PM values that are larger than $P_2$. In particular, losing path 582 has a PM value of $P_2+\Delta_3$, and losing path 584 has an even larger PM value of $P_2+\Delta_3+\Delta_4$.

At the beginning of a second step of the traceback process, the values for the error metric vectors are set according to the end of the first step as described in relation to FIG. 4. In particular, $$eM_{u,0} = \begin{bmatrix} \Delta_1 \\ \infty \\ \Delta_1+\Delta_2 \end{bmatrix}, eM_{u,1} = \begin{bmatrix} \infty \\ \infty \\ \Delta_1+\Delta_2 \end{bmatrix}, \text{ and } eM_{u,2} = \begin{bmatrix} \infty \\ \Delta_1 \\ \infty \end{bmatrix}.$$

The process as described in relation to FIG. 4 is repeated for losing paths 582 and 584.

At $t=3$, the value for both losing paths 582 and 584 is $(00)_2$, indicating zero error. In this case, none of the elements in the error metric vector $eM_{u,3}$ are updated.

At $t=2$, the value for losing path 582 is $(11)_2$, and the value for losing path 584 is $(01)_2$. An XOR operation is performed between the most likely value $u_{ML}(t=2)$ (i.e., $(10)_2$) and each of the error symbol values. In particular, for losing path 582, $(10)_2$ XOR $(11)_2$ is $(01)_2$. Thus, $\lambda_u(1)$ is set to be equal to the negative of the PM of losing path 582, or $-(P_2+\Delta_3)$. Furthermore, for losing path 584, $(10)_2$ XOR $(01)_2$ is $(11)_2$. Thus, $\lambda_u(3)$ is set to be equal to the negative of the PM of losing path 584, or $-(P_2+\Delta_3+\Delta_4)$. Moreover, the third (for losing path 582) and first (for losing path 584) elements of $eM_{u,2}$ are compared to $\Delta_3$ and $\Delta_3+\Delta_4$, respectively. Because the third and first elements of $eM_{u,2}$ are both $\infty$, the values are appropriately updated such that $$eM_{u,2} = \begin{bmatrix} \Delta_3+\Delta_4 \\ \Delta_1 \\ \Delta_3 \end{bmatrix}.$$

At $t=1$, the value for losing path 582 is $(00)_2$, indicating zero error. However, the value for losing path 584 is $(01)_2$, indicating that the first element of $eM_{u,1}$ ($\infty$) should be replaced with $\Delta_3+\Delta_4$. Thus, $$eM_{u,1} = \begin{bmatrix} \Delta_3+\Delta_4 \\ \infty \\ \Delta_1+\Delta_2 \end{bmatrix}.$$

At $t=0$, the value for losing path 582 is $(10)_2$, and the value for losing path 584 is $(11)_2$. This indicates that the second and third elements of $eM_{u,0}$ should be compared to $\Delta_3$ and $\Delta_3+\Delta_4$, respectively. Since the second element is $\infty$, the second element is replaced with $\Delta_3$. However, the third element has value $\Delta_1+\Delta_2$, such that the third element is replaced with $\min(\Delta_1+\Delta_2,\Delta_3+\Delta_4)$. Thus, $$eM_{u,0} = \begin{bmatrix} \Delta_1 \\ \Delta_3 \\ \min(\Delta_1+\Delta_2,\Delta_3+\Delta_4) \end{bmatrix}.$$

The steps described in relation to FIGS. 4 and 5 may be repeated (with more and more losing paths in consideration) until all the initial $\infty$ values of the error metrics $eM_{u,t}$ are replaced with finite values and all error metrics at all time instances are used. However, in some cases, it is possible that an initial ∞ value in the error metric vector is not replaced even after all losing paths are considered at all relevant time instances. This indicates a high level of confidence in the initial Viterbi decision for the corresponding symbol.

Figure 6:
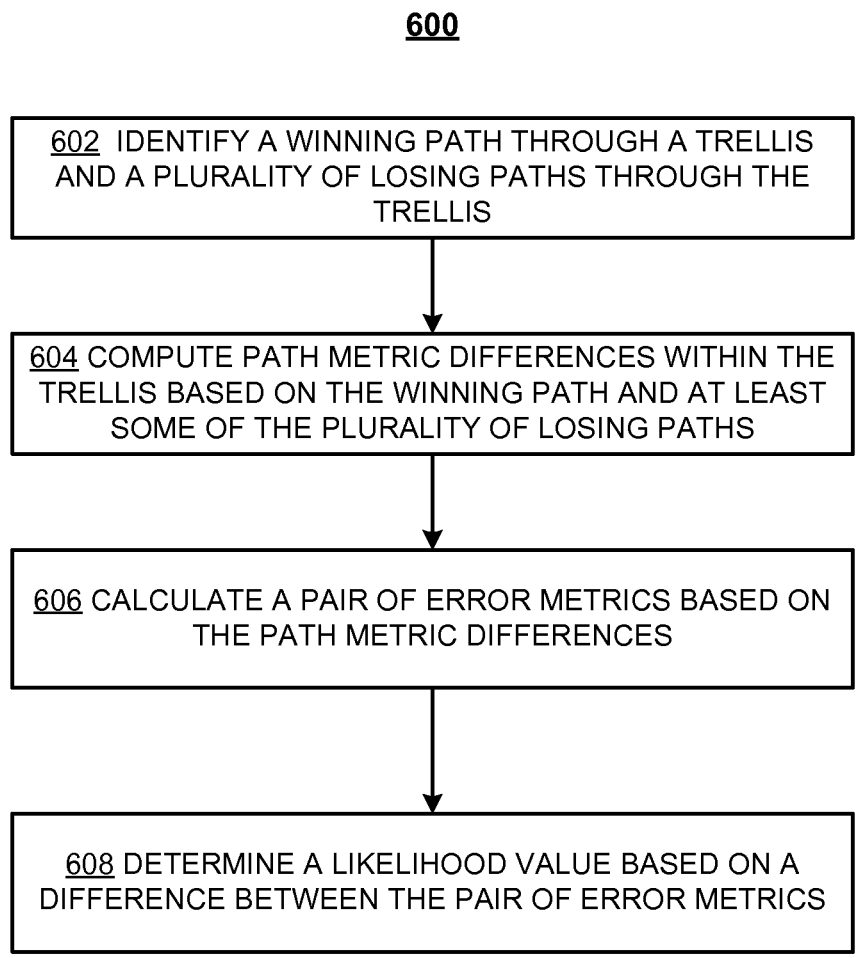
FIG. 6 is a flow chart of a process for calculating a likelihood value, in accordance with an embodiment of the present disclosure.

FIG. 6 is a flowchart of a process 600 for determining a likelihood value. For example, modified Viterbi detector 200 may execute process 600 to determine a likelihood value such as a log likelihood ratio value based on the error metric values as described in relation to FIGS. 4 and 5.

At 602, modified Viterbi detector 200 identifies a winning path through a trellis and a plurality of losing paths through the trellis. As is described in relation to FIG. 2, the winning path 246 may be determined by a nonlinear Viterbi detector 244 and be provided to a binary SOVA traceback block 250. The winning path 246 may correspond to winning path 470 in FIG. 4 or to winning path 580 in FIG. 5, and may generally correspond to a most likely path or a best path with a minimal path metric value. The losing paths that are identified at 602 correspond to other candidate paths that have path metric values that are greater than the path metric value of the winning path. The losing paths may correspond to losing paths 472 and 474 in FIG. 4 or to losing paths 582 and 584 in FIG. 5, or a combination thereof.

At 604, path metric differences within the trellis are computed based on the winning path and at least some of the plurality of losing paths that were identified at 602. As described in relation to FIGS. 4 and 5, path metric differences correspond to the Δ values and represent differences in path metrics between the winning path and a losing path. For example, the path metric difference between winning path 470 and losing path 472 is $\Delta_1$, the path metric difference between winning path 470 and losing path 474 is $\Delta_1+\Delta_2$, the path metric difference between winning path 580 and losing path 582 Δs $O_3$, and the path metric difference between winning path 580 and losing path 584 is $\Delta_3+\Delta_4$.

At 606, a pair of error metrics is calculated based on the path metric differences that were computed at 604. As is described in relation to FIGS. 4, 5, and 7, a set of error metric vectors are initialized to have elements of ∞, and are iteratively updated based on symbol values of the various losing paths under consideration and based on a comparison between a current value of the error metric and a path metric difference. When the current value of the error metric exceeds the path metric difference, the value of the error metric is updated to be equal to the path metric difference. This process is iteratively repeated for multiple losing paths, across multiple time instances, and for each element of the error metric vector, until all (or a threshold number) of the ∞ values in the error metrics are replaced with finite values.

In some embodiments, the first error metric in the pair of error metrics is determined based on a most likely symbol $u_{ML}$ in the winning path and another symbol $u_i$. In particular, the first error metric in the pair is determined based on an exclusive OR operation between $u_{ML}$ and $u_i$. A second error metric in the pair is determined based on the most likely symbol $u_{ML}$. In this way, a reference value for each error metric in the pair of error metrics is a most likely symbol $u_{ML}$ in the winning path.

At 608, a likelihood value is determined based on a difference between the pair of error metrics. As is described in detail in relation to FIG. 7, the likelihood value for a symbol $u_i$ may be written as a difference between a pair of error metrics calculated at 606. In particular, the first error metric is based on an exclusive OR operation between the most likely symbol $u_{ML}$ and the symbol $u_i$, while the second error metric is based on the most likely symbol $u_{ML}$. In some embodiments, the likelihood value is a log likelihood value that is the difference between the two error metrics in the pair.

FIG. 7 is a flowchart of a process 700 for updating error metric values and calculating likelihood values. For example, modified Viterbi detector 200 may execute process 700 to update the error metric values as described in relation to FIGS. 4 and 5. In particular, modified Viterbi detector 200 may execute process 700 by retrieving a winning path with path metric $PM_{ML}$ (702), initializing a time interval t=0 (704), initializing all elements in an error metric $eM_{u,t}$ to ∞ (706), selecting symbol value $u_{ML}$ at time t as a reference value (708), initializing a candidate error counter k=1 (710), and initializing a losing path counter p=1 (712). Modified Viterbi detector 200 compares a current error symbol value for the p-th losing path at time t to the candidate error counter k (714). If the current error symbol value is equal to k, then the k-th element of the error metric vector $eM_{u,t}$ is compared to the difference between the path metric of the p-th losing path ($PM_p$) and the path metric of the winning path ($PM_{ML}$) (716). If the k-th element of the error metric vector $eM_{u,t}$ exceeds the difference, the k-th element is updated to be equal to the difference (720). The losing path counter p is incremented (718), and the next losing path is considered until all P losing paths have been considered (722). The candidate error counter k is incremented (726) until all q−1 candidate errors have been considered (724). The time instance t is incremented (730) until all time instances T have been processed (728). After the values for $eM_{u,t}$ have been appropriately updated, LLR values are computed based on the values of the elements in each $eM_{u,t}$ (732).

In particular, at 732, symbol LLR computation circuitry 252 receives the updated error metric values $eM_{u,t}$ from binary SOVA traceback block 250 and processes $eM_{u,t}$ to obtain corresponding LLR values. An LLR value for a symbol value $u_i$ may be defined as:

$$L_u(u_i)=\lambda_u(0)-\lambda_u(u_i) \quad (8)$$

The above equation may be rewritten as:

$$L_u(u_i)=[\lambda_u(u_{ML})-\lambda_u(u_i)]-[\lambda_u(u_{ML})-\lambda_u(0)] \quad (9)$$

by adding a likelihood value associated with the most likely symbol $u_{ML}$ and then subtracting the same likelihood value to the right hand side of the equation. By writing the LLR in this form, the LLR can be rewritten in terms of the error metrics. In particular, because $eM_u(u_{ML} \oplus u_i)$ is equal to $\lambda_u(u_{ML})-\lambda_u([u_{ML}|u_{ML} \oplus u_i])$, which is equal to $\lambda_u(u_{ML})-\lambda_u(u_i)$ the LLR value may be written as:

$$L_u(u_i)=eM_u(u_{ML} \oplus u_i)-eM_u(u_{ML}) \quad (10)$$

The most recent values of $eM_u$ at the end of the second step described in relation to FIG. 5 may be plugged into Eq. 10 to compute the entries of the LLR vector. In an example, to compute the second entry (where $u_i=1$) of the LLR vector at time t=0, $L_u(1)=eM_u(u_{ML} \oplus 1)-eM_u(u_{ML})$. Because at time 0, $u_{ML}=2$, the second entry of the LLR vector may be written as $L_u(1)=eM_u(2 \oplus 1)-eM_u(2)=eM_u(3)-eM_u(2)$. As described in relation to FIG. 5, at time t=0, $eM_u(3)=\min(\Delta_1+\Delta_2,\Delta_3+\Delta_4)$. Assuming that $\Delta_1+\Delta_2<\Delta_3+\Delta_4$, $eM_u(3)=\Delta_1+\Delta_2$. Moreover, at time t=0, $eM_u(2)=\Delta_3$. Thus, $L_u(1)=\Delta_1+\Delta_2-\Delta_3$. The rest of the values of the LLR vector at different time instances may be similarly computed, and the LLR values may be written as:

$$L_u(t=0) = \begin{bmatrix} 0 \\ \Delta_1 + \Delta_2 - \Delta_3 \\ -\Delta_3 \\ \Delta_1 - \Delta_3 \end{bmatrix} \quad (11)$$

$$L_u(t=1) = \begin{bmatrix} 0 \\ -\Delta_3 - \Delta_4 \\ \Delta_1 + \Delta_2 - \Delta_3 - \Delta_4 \\ \infty \end{bmatrix} \quad (12)$$

$$L_u(t=2) = \begin{bmatrix} 0 \\ \Delta_3 - \Delta_1 \\ -\Delta_1 \\ \Delta_3 + \Delta_4 - \Delta_1 \end{bmatrix} \quad (13)$$

Figure 8:
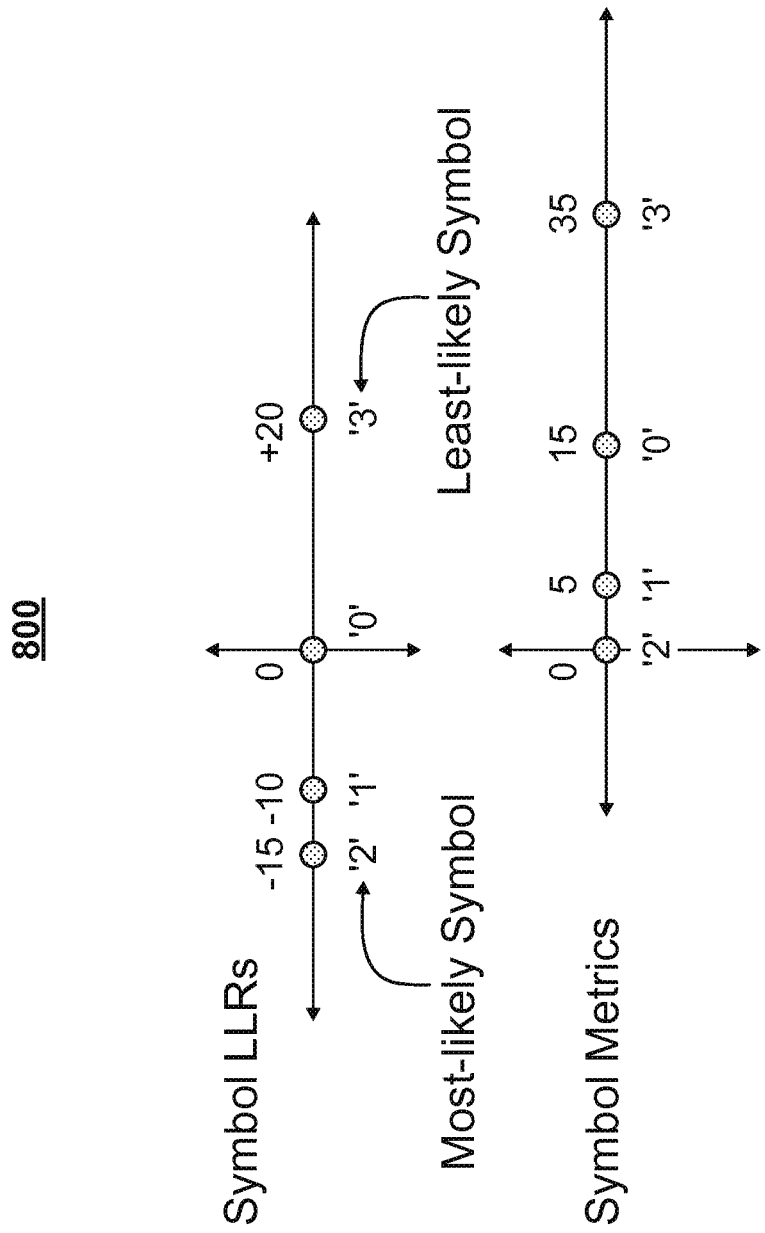
FIG. 8 is a graphical illustration of representations of symbol likelihood values and symbol metrics, in accordance with an embodiment of the present disclosure.

FIG. 8 is a graphical illustration of representations of symbol likelihood values and symbol metrics. Symbol likelihood values may be negative or positive, and the range of likelihood values can be large. Sometimes, hardware is implemented in such a way that only positive values are used. Thus, storing likelihood values, which may be negative or positive, may be problematic. To remedy this problem, a set symbol metrics may be defined as a shifted set of LLR values. In particular, a symbol metric is an offset version of a corresponding LLR value, where the amount of offset is defined such that all symbol metrics are greater than or equal to zero. In an example, the magnitude of the most negative valued LLR value (i.e., the most likely symbol) in a set of LLR values defines the amount of offset, such that the most negative valued LLR value is shifted to the origin for the corresponding symbol metric. Similarly, the other LLR values in the set of LLR values are shifted by the same offset amount, such that relative differences between LLR values in the set are preserved.

In FIG. 8, two number lines are shown, where the left-most points correspond to the most likely symbols, while the right-most points correspond to the least likely symbols. The top number line shows symbol LLR values having two negative values −15 (for the most likely symbol 2) and −10 (for the symbol 1), a zero value (for the symbol 0), and a positive value 20 (for the least likely symbol 3). The bottom graph shows corresponding symbol metric values having the values 0 (for the most likely symbol 2), 5 (for the symbol 1), 15 (for the symbol 0), and 35 (for the least likely symbol 3). Thus, in the example shown in FIG. 8, the symbol metric values represent shifted versions of the LLR values, such that the most likely symbol has a symbol metric value of zero. For example, the symbol metric values may be provided to nonlinear Viterbi detector 244 instead of, or in addition to, the a-priori LLR values 242. A symbol metric sM may be written in terms of the LLR values in accordance with:

$$sM_u(u_i) = L_u(u_i) - \min_{\forall u_i}\{L_u(u_i)\} = (L_u(u_i) - L_u^{min}) \quad (14)$$

Using symbol metrics instead of LLR values may be desirable if computation costs are limited. In particular, in some cases, hardware is implemented in a way such that only positive values are used. In this instance, it may be desirable to use symbol metrics instead of LLR values. In particular, computing using a symbol metric does not require keeping track of an extra bit for the sign of the symbol metric, as is required for performing a computation with an LLR value. Furthermore, converting from a symbol metric value to a corresponding LLR value is a simple computation and can be performed easily and quickly.

In general, for non-binary symbols, it may be easier or cheaper for a hardware system to compute values for the error metrics than for LLR values. For example, a smaller number of bits may be required to store an error metric value compared to an LLR value. In addition, as described herein, converting from an error metric value to an LLR value is a simple computation and can be performed easily and quickly. Thus, it may be desirable to use the error metric representation for storage and to use the symbol metric representation for computation, because the LLR values may be computed from the error metric or from the symbol metric.

In an example, for a set of candidate symbol values taken from GF(4), LLR values, error metric values, and symbol metric values may be associated with different storage and/or computational requirements. For example, a set of LLR values may be written as:

$$L_u = \begin{bmatrix} 0 \\ \log\left(\frac{p_u(u=0)}{p_u(u=1)}\right) \\ \log\left(\frac{p_u(u=0)}{p_u(u=2)}\right) \\ \log\left(\frac{p_u(u=0)}{p_u(u=3)}\right) \end{bmatrix} \quad (15)$$

In general, the LLR value for the $u_j$ entry may be written as:

$$L_u(u_j) = \lambda_u(u_0) - \lambda_u(u_j) \quad (16)$$

LLR values use signed entries, such that both the sign (one bit) and the magnitude (five bits) need to be stored. In this case, because there are three non-zero entries in $L_u$, storing the above representation of $L_u$ requires 3×(5+1)=18 bits/symbol.

A set of error metric values may be written as:

$$eM_u = \begin{bmatrix} 0 \\ \log\left(\frac{p_u(u=u_{ML})}{p_u(u=[u_{ML}\oplus 1])}\right) \\ \log\left(\frac{p_u(u=u_{ML})}{p_u(u=[u_{ML}\oplus 2])}\right) \\ \log\left(\frac{p_u(u=u_{ML})}{p_u(u=[u_{ML}\oplus 3])}\right) \end{bmatrix} \quad (17)$$

In general, the error metric value for the $u_j$ entry may be written as:

$$eM_u(u_j) = \lambda_u(u_{ML}) - \lambda_u(u_{ML}\oplus u_j) \quad (18)$$

Error metric values are unsigned, such that only the magnitude (five bits) need to be stored. However, two additional bits need to be stored for the most likely symbol $u_{ML}$, which can dynamically change for different time instances. Thus, storing the above representation of $eM_u$ requires (3×5)+2=17 bits/symbol.

A set of symbol metric values may be written as:

$$sM_u = \begin{bmatrix} \log\left(\frac{p_u(u=u_{ML})}{p_u(u=0)}\right) \\ \log\left(\frac{p_u(u=u_{ML})}{p_u(u=1)}\right) \\ \log\left(\frac{p_u(u=u_{ML})}{p_u(u=2)}\right) \\ \log\left(\frac{p_u(u=u_{ML})}{p_u(u=3)}\right) \end{bmatrix} \quad (19)$$

In general, the symbol metric value for the $u_j$ entry may be written as:

$$sM_u(u_j) = \lambda_u(u_{ML}) - \lambda_u(u_j) \quad (20)$$

As described above, one of the entries of $sM_u$ is zero because one of the symbols u=0, 1, 2, 3 corresponds to the most likely symbol. However, unlike for $L_u$ and $eM_u$, the most likely symbol does not necessarily correspond to the first entry. Thus, four values are stored for the symbol metric value. Furthermore, the entries of $sM_u$ are unsigned, such that only the magnitude (five bits) need to be stored. Thus, storing the above representation of $sM_u$ requires 4×5=20 bits/symbol.

In some embodiments, an error metric value may be converted to a symbol metric value directly, without converting to an LLR value. In particular, $$sM_u(u_j) = eM_u(u_{ML} \oplus u_j) \quad (21)$$

Furthermore, a symbol metric may be converted to an error metric value directly, via $$eM_u(u_j) = sM_u(u_{ML} \oplus u_j) \quad (22)$$

Figure 9:
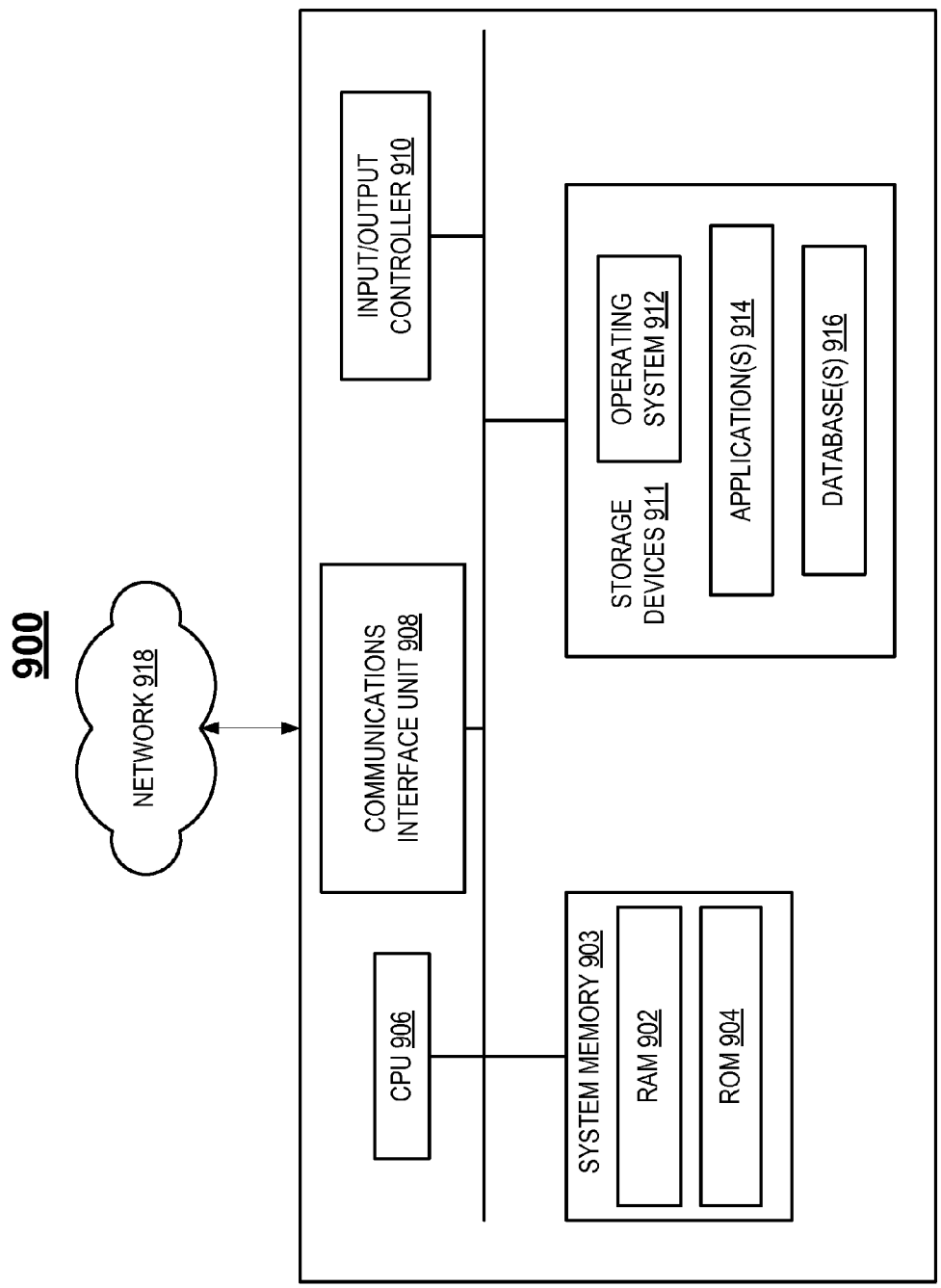
FIG. 9 is a block diagram of a computing device, for performing any of the processes described herein, in accordance with an embodiment of the present disclosure.

FIG. 9 is a block diagram 900 of a computing device, such as any of the components of the system of FIG. 1, for performing any of the processes described herein, in accordance with an embodiment of the disclosure. Each of the components of these systems may be implemented on one or more computing devices 900. In certain aspects, a plurality of the components of these systems may be included within one computing device 900. In certain embodiments, a component and a storage device 911 may be implemented across several computing devices 900.

The computing device 900 comprises at least one communications interface unit 908, an input/output controller 910, system memory 903, and one or more data storage devices 911. The system memory 903 includes at least one random access memory (RAM 902) and at least one read-only memory (ROM 904). All of these elements are in communication with a central processing unit (CPU 906) to facilitate the operation of the computing device 900. The computing device 900 may be configured in many different ways. For example, the computing device 900 may be a conventional standalone computer or, alternatively, the functions of computing device 900 may be distributed across multiple computer systems and architectures. In FIG. 9, the computing device 900 is linked, via network 918 or local network, to other servers or systems.

The computing device 900 may be configured in a distributed architecture, wherein databases and processors are housed in separate units or locations. Some units perform primary processing functions and contain, at a minimum, a general controller or a processor and a system memory 903. In distributed architecture embodiments, each of these units may be attached via the communications interface unit 908 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 906 comprises a processor, such as one or more conventional microprocessors and one or more supplementary co-processors such as math co-processors for offloading workload from the CPU 906. The CPU 906 is in communication with the communications interface unit 908 and the input/output controller 910, through which the CPU 906 communicates with other devices such as other servers, user terminals, or devices. The communications interface unit 908 and the input/output controller 910 may include multiple communication channels for simultaneous communication with, for example, other processors, servers or client terminals.

The CPU 906 is also in communication with the data storage device 911. The data storage device 911 may comprise an appropriate combination of magnetic, optical or semiconductor memory, and may include, for example, RAM 902, ROM 904, flash drive, an optical disc such as a compact disc or a hard disk or drive. The CPU 906 and the data storage device 911 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 906 may be connected to the data storage device 911 via the communications interface unit 908. The CPU 906 may be configured to perform one or more particular processing functions.

The data storage device 911 may store, for example, (i) an operating system 912 for the computing device 900; (ii) one or more applications 914 (e.g., computer program code or a computer program product) adapted to direct the CPU 906 in accordance with the systems and methods described here, and particularly in accordance with the processes described in detail with regard to the CPU 906; or (iii) database(s) 916 adapted to store information that may be utilized to store information required by the program.

The operating system 912 and applications 914 may be stored, for example, in a compressed, an uncompiled and an encrypted format, and may include a computer program code. The instructions of the program may be read into a main memory of the processor from a computer-readable medium other than the data storage device 911, such as from the ROM 904 or from the RAM 902. While execution of sequences of instructions in the program causes the CPU 906 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions as described herein. The program also may include program elements such as an operating system 912, a database management system and "device drivers" that allow the processor to interface with computer peripheral devices (e.g., a video display, a keyboard, a computer mouse, etc.) via the input/output controller 910.

The term "computer-readable medium" as used herein refers to any non-transitory medium that provides or participates in providing instructions to the processor of the computing device 900 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 906 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 900 (e.g., a server) can receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method of generating a likelihood value which detects an error, the method comprising:
   identifying, by at least one circuitry a winning path through a trellis and a plurality of losing paths through the trellis;
   computing, by the at least one circuitry, path metric differences within the trellis based on the winning path and at least some of the plurality of losing paths;
   calculating, by the at least one circuitry, a pair of error metrics based on the path metric differences; and
   determining, by the at least one circuitry, the likelihood value based on a difference between the pair of error metrics to detect an error in data transmitted through a channel.

2. The method of claim 1, wherein a first error metric in the pair is determined based on a most likely symbol $u_{ML}$ in the winning path and another symbol $u_i$, and wherein a second error metric in the pair is determined based on the most likely symbol $u_{ML}$.

3. The method of claim 2, wherein the first error metric in the pair is determined based on an exclusive OR operation between $u_{ML}$ and $u_i$.

4. The method of claim 1, wherein a reference value for each error metric in the pair is a most likely symbol $u_{ML}$ in the winning path.

5. The method of claim 1, wherein the pair of error metrics are elements in a vector of error metrics, wherein a length of the vector of error metrics is one less than a number of candidate symbols.

6. The method of claim 1, wherein calculating the pair of error metrics comprises updating, by the at least one circuitry, an error metric in the pair to be equal to one of the path metric differences when it is determined that a previous value of the error metric in the pair is greater than the one of the path metric differences.

7. The method of claim 1, further comprising determining, by the at least one circuitry, a plurality of additional likelihood values, the likelihood value and each additional likelihood value being associated with a corresponding candidate symbol value.

8. The method of claim 7, further comprising offsetting, by the at least one circuitry, the likelihood value and the plurality of additional likelihood values by an offset amount to obtain a plurality of symbol metric values.

9. The method of claim 8, wherein the offset amount is a magnitude of the likelihood value that corresponds to a most likely symbol $u_{ML}$ of the winning path.

10. The method of claim 1, wherein the likelihood value is used in a soft output Viterbi algorithm (SOVA).

11. A detector comprising circuitry, which detects an error and is communicatively coupled to a memory, wherein the circuitry comprises:
    detecting circuitry which:
        identifies a winning path through a trellis and a plurality of losing paths through the trellis;
        computes path metric differences within the trellis based on the winning path and at least some of the plurality of losing paths;
    traceback circuitry which calculates a pair of error metrics based on the path metric differences; and
    computation circuitry which determines a likelihood value based on a difference between the pair of error metrics to detect an error in data transmitted through a channel.

12. The detector of claim 11, wherein a first error metric in the pair is determined based on a most likely symbol $u_{ML}$ in the winning path and another symbol $u_i$, and wherein a second error metric in the pair is determined based on the most likely symbol $u_{ML}$.

13. The detector of claim 12, wherein the first error metric in the pair is determined based on an exclusive OR operation between $u_{ML}$ and $u_i$.

14. The detector of claim 11, wherein a reference value for each error metric in the pair is a most likely symbol $u_{ML}$ in the winning path.

15. The detector of claim 11, wherein the pair of error metrics are elements in a vector of error metrics, wherein a length of the vector of error metrics is one less than a number of candidate symbols.

16. The detector of claim 11, wherein the traceback circuitry calculates the pair of error metrics by updating an error metric in the pair to be equal to one of the path metric differences when it is determined that a previous value of the error metric in the pair is greater than the one of the path metric differences.

17. The detector of claim 11, wherein the circuitry further determines a plurality of additional likelihood values, the likelihood value and each additional likelihood value being associated with a corresponding candidate symbol value.

18. The detector of claim 17, wherein the circuitry further offsets the likelihood value and the plurality of additional likelihood values by an offset amount to obtain a plurality of symbol metric values.

19. The detector of claim 18, wherein the offset amount is a magnitude of the likelihood value that corresponds to a most likely symbol $u_{ML}$ of the winning path.

20. The detector of claim 11, wherein the detector is a soft output Viterbi algorithm (SOVA) detector.

* * * * *